United States Patent [19]
Dennison et al.

[11] Patent Number: 5,494,841
[45] Date of Patent: Feb. 27, 1996

[54] SPLIT-POLYSILICON CMOS PROCESS FOR MULTI-MEGABIT DYNAMIC MEMORIES INCORPORATING STACKED CONTAINER CAPACITOR CELLS

[75] Inventors: Charles H. Dennison, Meridian; Aftab Ahmad, Boise, both of Id.

[73] Assignee: Micron Semiconductor, Inc., Boise, Id.

[21] Appl. No.: 322,807

[22] Filed: Oct. 13, 1994

Related U.S. Application Data

[63] Continuation-in-part of Ser. No. 138,585, Oct. 15, 1993, abandoned.

[51] Int. Cl.$^6$ .............................. H01L 21/70; H01L 27/00
[52] U.S. Cl. ........................... 437/52; 437/60; 437/919
[58] Field of Search ............................... 437/47, 60, 52, 437/919

[56] References Cited

U.S. PATENT DOCUMENTS

| | | | |
|---|---|---|---|
| 5,030,585 | 7/1991 | Gonzalez et al. | 437/47 |
| 5,134,085 | 7/1992 | Gilgen et al. | 437/52 |
| 5,238,862 | 8/1993 | Blalock et al. | 437/52 |

Primary Examiner—Mary Wilczewski
Assistant Examiner—H. Jey Tsai
Attorney, Agent, or Firm—Holland & Hart; Angus C. Fox, III

[57] ABSTRACT

This invention is a process for manufacturing dynamic random access memories using stacked container capacitor cells in a split-polysilicon CMOS manufacturing flow. The split-polysilicon flow denotes that N-channel and P-channel transistor gates are formed from a single conductive layer (typically a doped polysilicon layer) using separate masking steps. The focus of this invention is a CMOS manufacturing process flow which permits P-channel source/drain doping subsequent to capacitor formation. A main feature of the process is the deposition and planarization of a thick insulative mold layer subsequent to N-channel device patterning, but prior to P-channel device patterning. In one embodiment of the process, portions of this insulative layer overlying the P-channel transistor regions are removed during the storage-node contact etch. Thus, a low-aspect-ratio etch can be employed to pattern P-channel devices, and a blanket P+ implant may be performed without implanting the P-type impurity into source/drain regions of the N-channel devices. Another important feature of the invention is the incorporation of P-channel gate sidewall spacers and offset P-channel implants into the process flow.

18 Claims, 19 Drawing Sheets

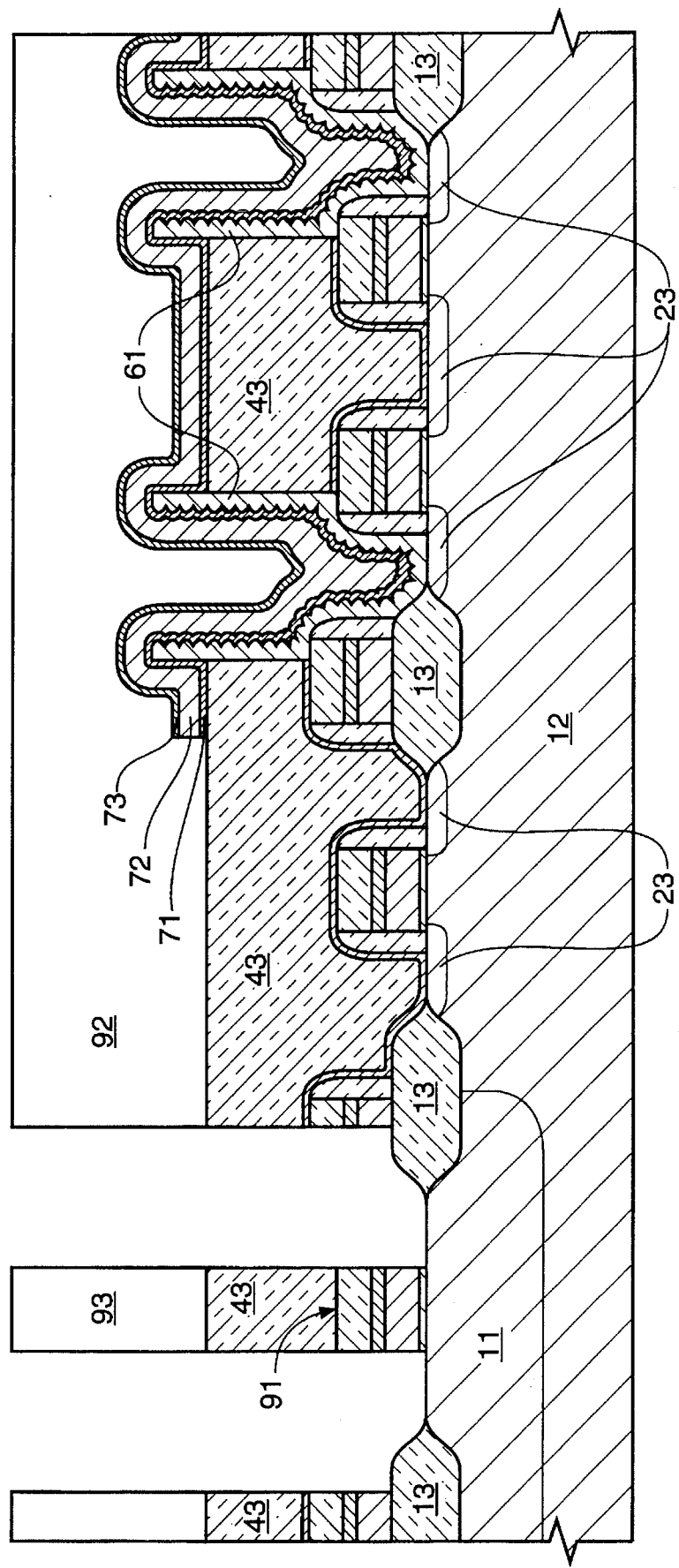

SPLIT-POLYSILICON CMOS PROCESS FOR MULTI-MEGABIT DYNAMIC MEMORIES INCORPORATING STACKED CONTAINER CAPACITOR CELLS

This is a CIP of application(s) Ser. No. 08/138,585 filed on Oct. 15, 1993, abandoned.

FIELD OF THE INVENTION

This invention relates to integrated circuit manufacturing technology and, more specifically, to low-cost processes utilizing a reduced number of mask sets, for manufacturing CMOS dynamic random access memories. The instant process integrates stacked capacitor container-type cells in a "split-polysilicon" process flow in which N-channel and P-channel devices are patterned using separate masks.

BACKGROUND OF THE INVENTION

The business of producing dynamic random access memory (DRAM) devices is a very competitive, high-volume business. Process efficiency and manufacturability, as well as product quality, reliability, and performance are the key factors that determine the economic success of such a venture.

Each cell within a DRAM device, an individually-addressable location for storing a single bit of digital data, is comprised of two main components: a field-effect access transistor and a capacitor. As component density in memory chips has increased, it has been necessary to at least maintain cell capacitance as cell size shrinks. Each new generation of DRAM devices generally has an integration level that is four times that of the generation which it replaced. Such a quadrupling of device number per chip is normally accompanied by a decrease in device geometries. All DRAM memories of 4-megabit and greater density utilize cell designs having three-dimensional capacitors. Although both trench and stacked capacitor designs have proven serviceable at the 4-megabit level, most manufacturers now seem to favor the stacked capacitor design for its manufacturability and somewhat higher yield.

Most current-generation dynamic random access memories (DRAMs) utilize CMOS technology. Although the term "CMOS" is an acronym for (C)omplementary (M)etal (O)xide (S)emiconductor, the term CMOS is now more loosely applied to any integrated circuit in which both N-channel and P-channel field-effect transistors are used in a complementary fashion. Although CMOS integrated circuit devices are often referred to as "semiconductor" devices, such devices are fabricated from various materials which are either electrically conductive, electrically non-conductive or electrically semiconductive. Silicon, the most commonly used semiconductor material can be made conductive by doping it (introducing an impurity into the silicon crystal structure) with either an element such as boron which has one less valence electron than silicon, or with an element such as phosphorus or arsenic which have one more valence electron than silicon. In the case of boron doping, electron "holes" become the charge carriers and the doped silicon is referred to as positive or P-type silicon. In the case of phosphorus or arsenic doping, the additional electrons become the charge carriers and the doped silicon is referred to as negative or N-type silicon. If a mixture of dopants having opposite conductivity types is used, counter doping will result, and the conductivity type of the most abundant impurity will prevail. Silicon is used either in single-crystal or polycrystalline form. Polycrystalline silicon is referred to hereinafter as "polysilicon" or simply as "poly". Although polysilicon has largely replaced metal for the MOS device gates, the relatively low conductivity of that material (even when heavily doped) has led many semiconductor manufacturers to create a layer of refractory metal silicide on transistor gates in order to decrease sheet resistance and, thereby, increase device speed. In conventional DRAM processes, two additional poly layers are used for the lower and upper cell capacitor plates.

CMOS manufacturing processes generally begin with a lightly-doped P-type or N-type silicon substrate, or lightly-doped epitaxial silicon on a heavily doped substrate. Although P-type silicon is usually chosen as the starting material, selection of N-type silicon as the starting material changes the process very little, the primary difference being that for a given step, dopant types are reversed.

Triple polysilicon layer manufacturing processes for contemporary stacked-capacitor dynamic random access memories require some fourteen to eighteen masking steps. As device geometries shrink, each photolithographic step becomes more costly. In light of the costs associated with masking operations, manufacturing processes which permit a significant reduction in the number of masking operations are greatly preferred.

In 1982, Japanese patent number 57-17164 was issued to Masahide Ogawa. This patent teaches the fabrication of a CMOS integrated circuit by processing N-channel and P-channel devices separately. As with conventional CMOS processes, a single polysilicon layer is used to form both N-channel and P-channel gates. However, N-channel devices are formed first, with unetched polysilicon left in the future P-channel regions until N-channel processing is complete. The mask used to subsequently pattern the P-channel devices is also used to blanket and protect the already-formed N-channel devices. This process is herein referred to as the split-polysilicon CMOS process. The split-polysilicon CMOS process, though largely ignored by semiconductor manufacturers in the U.S. and abroad., has been used extensively by Micron Technology, Inc. of Boise, Idaho as a means to reduce the number of masking steps and, hence, the cost of manufacturing dynamic random access memories.

U.S. Pat. No. 5,134,085 discloses a split-polysilicon CMOS DRAM process which incorporates conventional stacked capacitors. Although conventional stacked capacitors are adequate for 4-megabit and 16-megabit densities, more complex capacitors are required for the 64-megabit density level and beyond. Cylindrically-shaped cell capacitors (commonly referred to as container-type capacitors) have gained favor in 64-megabit DRAM designs because they are relatively easy to manufacture, and also because capacitance may be increased simply by increasing stack height. However, high topography which results generally requires the processing of P-channel devices early in the manufacturing process (i.e., before the container-type capacitors are fabricated). The problem with this approach is that boron trifluoride, the dopant normally used to dope P-channel source/drain regions, diffuses relatively rapidly under elevated temperature conditions. If the doping occurs early in the process, the thermal budget remaining in the process will cause the P-channel dopant to diffuse into the channel regions where it will produce short-channel effects. The most serious of those effects is device leakage when a high signal is applied to the gate.

What is needed, therefore, is a split-polysilicon CMOS DRAM process which incorporates container capacitors in an efficient process flow having a low number of masking steps, and which permits P-channel processing late in the process sequence.

SUMMARY OF THE INVENTION

This is a process for fabricating a CMOS dynamic random access memory on an upper stratum of a silicon substrate or wafer. The focus of this invention is the integration of container cell capacitors in a split-polysilicon CMOS manufacturing process flow which permits P-channel source/drain doping subsequent to capacitor formation. In a split-polysilicon process flow, N-channel device gates and P-channel device gates are patterned and etched from the same first conductive (doped polysilicon) layer at different stages of the process flow. In this split-polysilicon process, N-channel gates are patterned and etched from the first polysilicon layer, while an unetched expanse of the first polysilicon layer is left in N-well regions. A main feature of this new process is the deposition and planarization of a thick insulative mold layer subsequent to N-channel device patterning, but prior to P-channel device patterning. Following deposition of the mold layer, storage-node contact openings are etched through the mold layer in the P-type regions within the array. A second conductive layer is then deposited which blankets both N-type regions and P-type regions and lines the storage-node contact openings. Portions of said second conductive layer which are on the upper surface of the mold layer are then removed, leaving those portions of the second conductive layer which line the storage-node contact openings. The mold layer may then be optionally thinned until portions of the second conductive layer which line the storage-node contact openings extend above the surface of the mold layer. After a cell dielectric layer is then formed on the upper surface of the second conductive layer, the dielectric layer is overlaid with a third conductive layer. Portions of the second and third conductive layers which are peripheral to the cell array are then removed. P-channel gates are then patterned from the unetched expanse of said first conductive layer. A P-channel source/drain implant follows.

In one embodiment of the process, portions of the mold layer overlying the N-well region (the regions where P-channel devices will be formed) are removed during the storage-node contact etch. Thus, a low-aspect-ratio etch can be employed to pattern P-channel devices, and a blanket P+ implant may be performed without implanting the P-type impurity into source/drain regions of the N-channel devices.

BRIEF DESCRIPTION OF THE DRAWINGS

FIG. 5A is a cross-sectional view of the portion of the in-process memory of FIG. 4 following the patterning and etching of the BPSG layer to form storage node contact openings;

FIGS. 9B and 9C are a cross-sectional view of the portion of the in-process memory of FIG. 8B following masking of the N-channel region, and patterning and etching of the unetched expanse of sandwich layers in the P-channel region.

PREFERRED EMBODIMENT OF THE INVENTION

Figure 1:
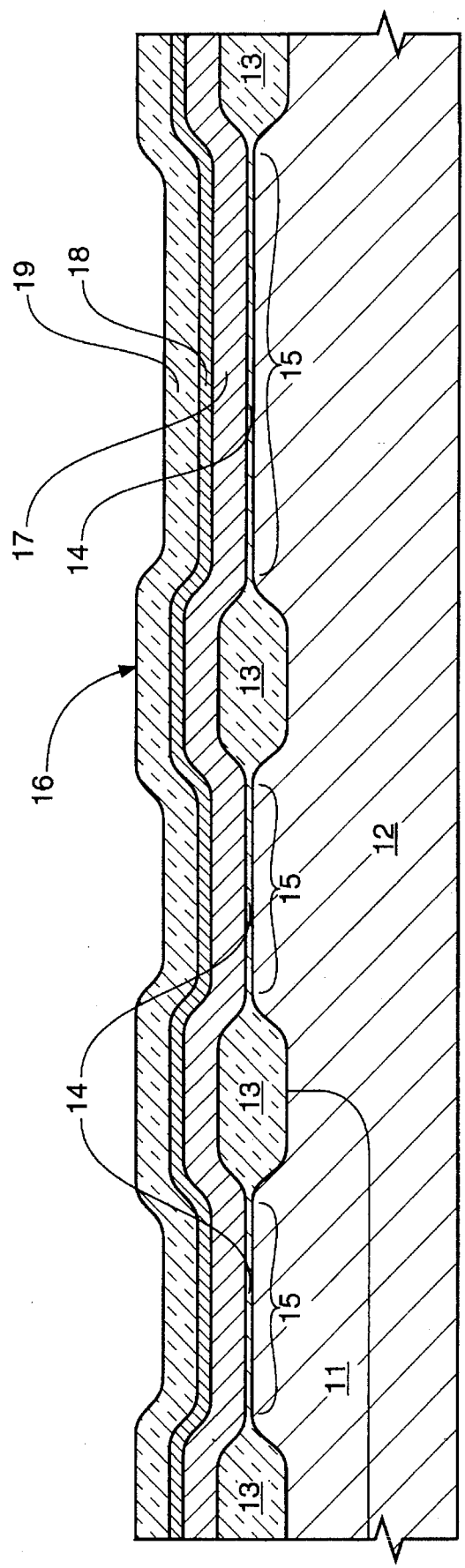
FIG. 1 is a cross-sectional view of a portion of an in-process dynamic random access memory at a stage of manufacture where N-well regions have been formed in a lightly-doped P-type substrate, silicon dioxide field isolation regions have been formed, a gate dielectric layer has been formed on active areas, and a three-layer sandwich, consisting of a first polysilicon layer which is doped to render it conductive, a silicon dioxide buffer layer and a thick silicon nitride layer, has been formed by sequential deposition steps.

Referring now to the cross-sectional view of the in-process DRAM circuitry FIG. 1, N-well regions 11 have been formed in a lightly-doped P-type substrate 12, silicon dioxide field isolation regions 13 have been formed, a gate dielectric layer 14 has been formed on active areas 15, and a three-layer stack 16, consisting of a first conductive layer 17, a silicon dioxide buffer layer 18 and a thick silicon nitride layer 19, has been formed by sequential deposition steps. Both N-channel and P-channel transistor gates will be formed from the three-layer stack 16. In a preferred embodiment of the process, the first conductive layer 17 is either doped polycrystalline silicon alone, or doped or undoped polycrystalline silicon that is coated with a refractory metal silicide to achieve reduced sheet resistance.

Figure 2:
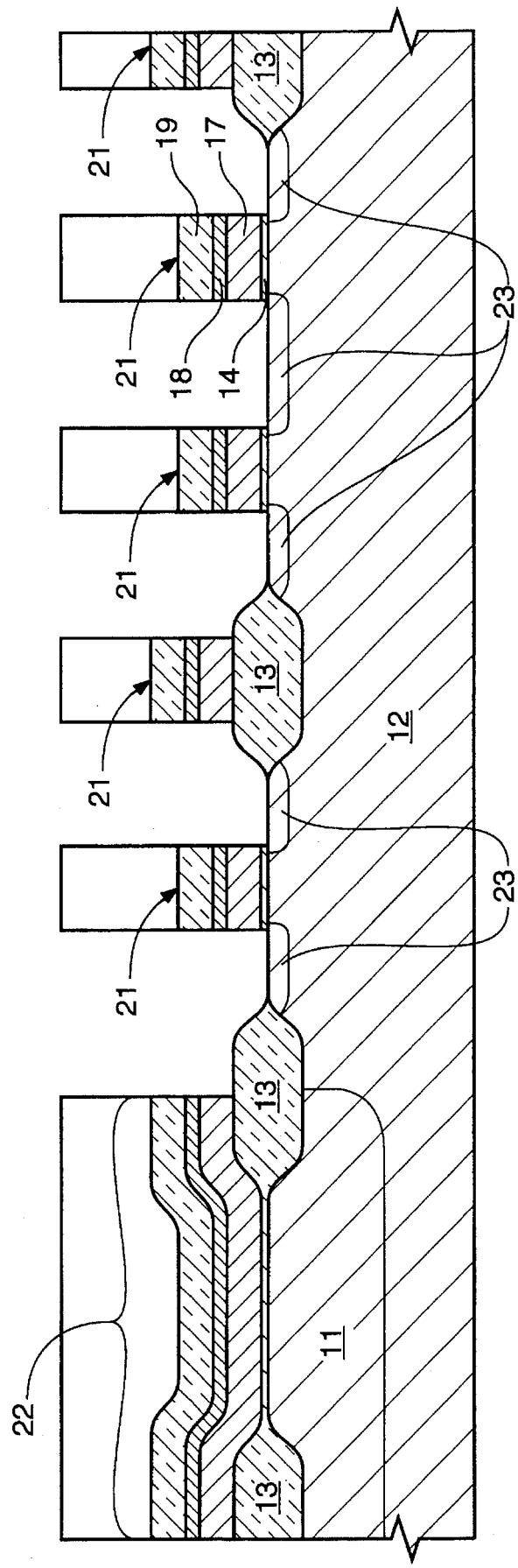
FIG. 2 is a cross-sectional view of the portion of the in-process memory of FIG. 1 following the patterning of the three-layer sandwich to form a series of wordlines in the N-channel region and an unetched expanse in the P-channel region (i.e., the N-well region)

Referring now to FIG. 2, the three-layer stack 16 of FIG. 1 has been patterned and etched to form a series of wordlines 21 in the N-channel region and an unetched three-layer expanse 22 in the P-channel region (i.e., the N-well region 11). The unetched three-layer expanse 22 is the distinguishing characteristic of a "split-polysilicon" CMOS DRAM process. At this point in the process, N-channel source/drain regions 23 are formed by implanting arsenic.

Figure 3:
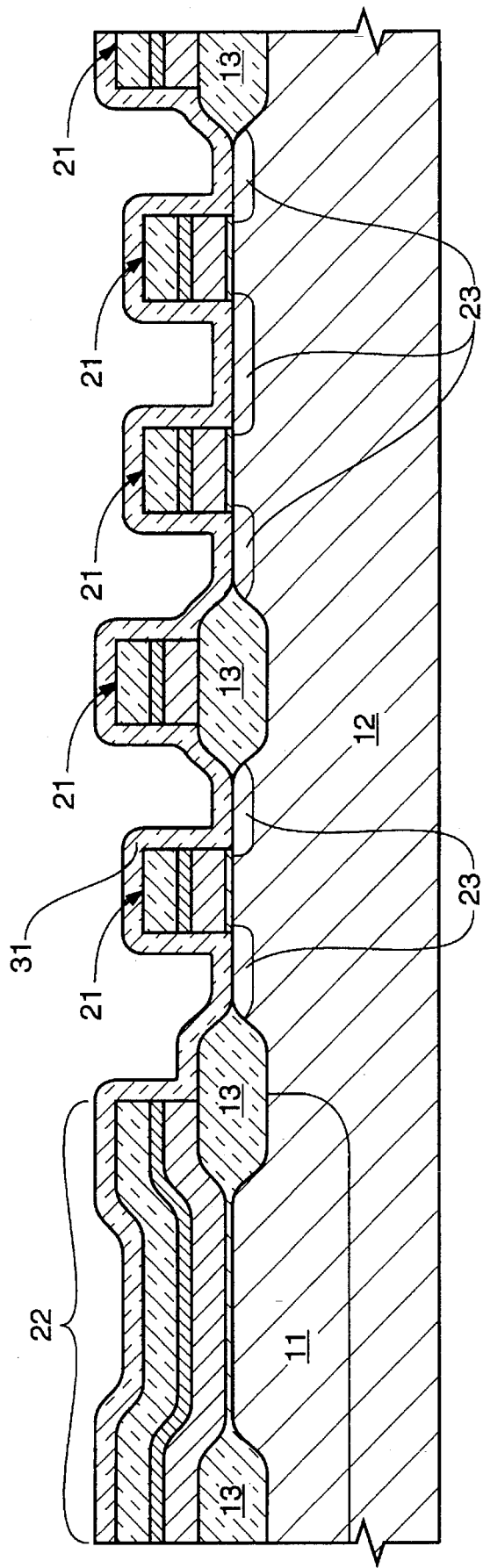
FIG. 3 is a cross-sectional view of the portion of the in-process memory of FIG. 2 following the blanket deposition of a silicon nitride spacer layer.

Referring now to FIG. 3, a silicon nitride spacer layer 31 has been deposited over all in-process circuitry.

Figure 4:
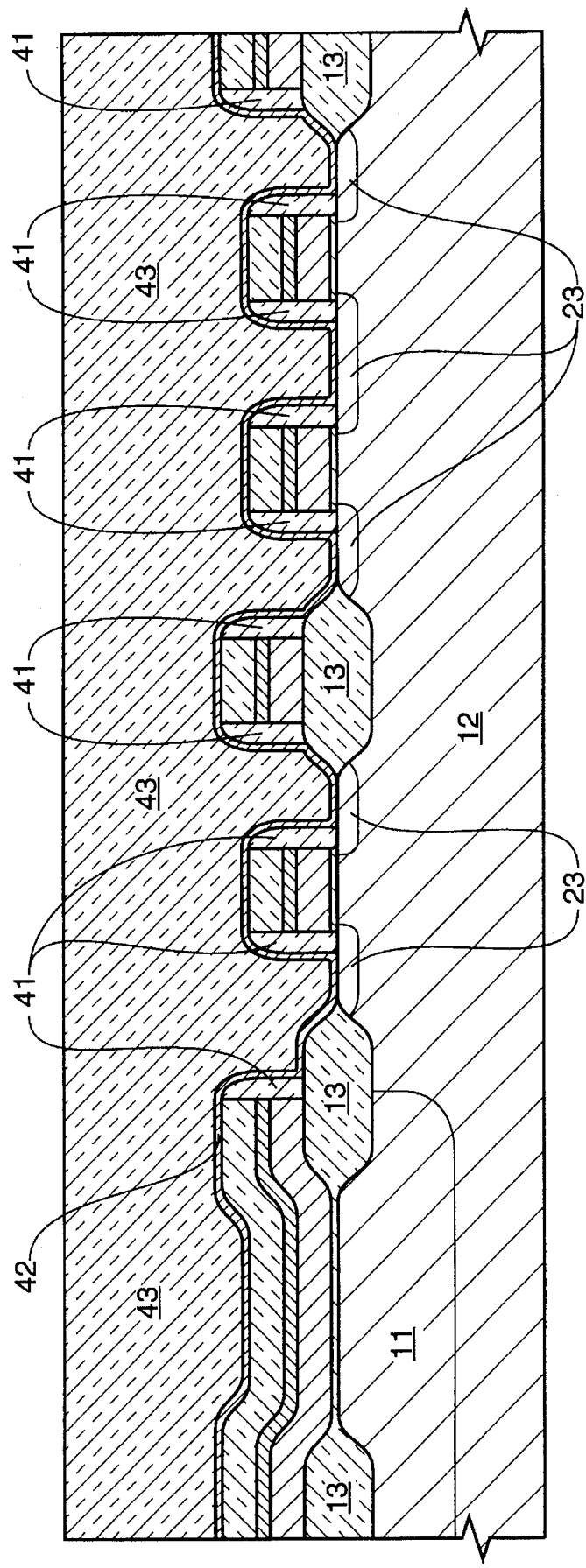
FIG. 4 is a cross-sectional view of the portion of the in-process memory of FIG. 3 following an anisotropic etch of the silicon nitride spacer layer to form spacers on the sidewalls of the wordlines and on the sidewall of the unetched expanse of the stacked sandwich layers, the blanket deposition of a silicon nitride etch stop layer, the primary purpose of which is to cover active areas, the deposition of a boro-phospho-silicate glass (BPSG) layer, and the planarization of the BPSG layer.

Referring now to FIG. 4, the silicon nitride spacer layer 31 has been anisotropically etched to form spacers 41 on the sidewalls of the wordlines 21 and on the sidewalls of the unetched expanse 22. The anisotropic etch is terminated at the point where the spacers 41 cover the edges of all three layers of each remnant of the sandwich 16. Following the formation of spacers a silicon nitride etch-stop layer 42 is deposited over all in-process circuitry. Following the deposition of the etch-stop layer 42, a thick insulative mold layer 43 is deposited on top of the etch-stop layer 42. Borophospho-silicate glass is deemed to be the preferred dielectric material from which the mold layer 43 is formed. After the mold layer 43 is deposited, it is planarized. Although a number of planarization techniques are known in the art, chemical mechanical planarization is deemed to be the preferred method. FIG. 4 represents the departing point for two distinct variations of the process. Thus, the process continues with either FIG. 5A or 5B.

Figure 5A:
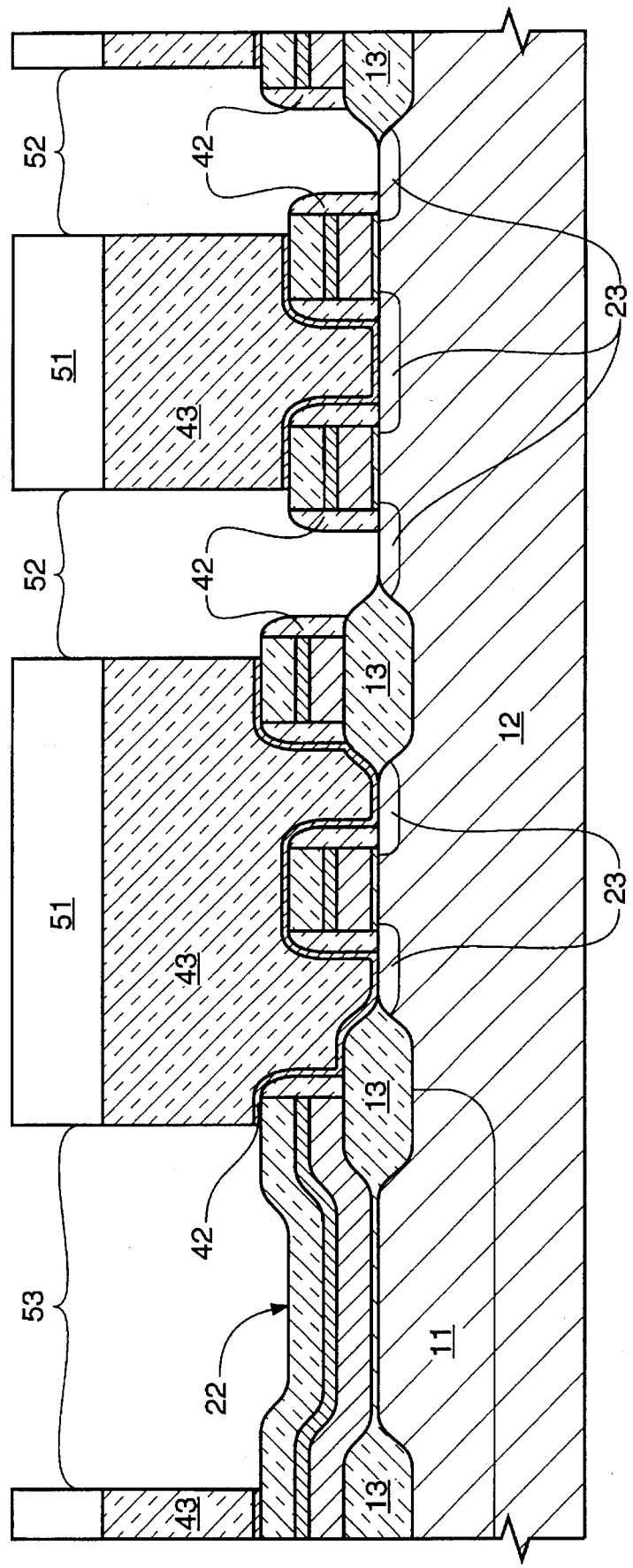
FIG. 5A is a cross-sectional view of the portion of the in-process memory of FIG. 4 following the patterning and etching of the BPSG layer to form storage node contact openings and remove that portion of the BPSG layer which overlies the P-channel region.

Referring now to FIG. 5A, which is the departing point for the second embodiment of the first pair of process variations, mold layer 43 has been patterned with a contact photoresist mask 51, and etched to form storage node contact openings 52, and to also remove those portions of the mold layer 43 that overlie the P-channel (N-well) region, thus creating a recessed region 53 in the mold layer 43 above the unetched expanse 22.

Figure 5B:
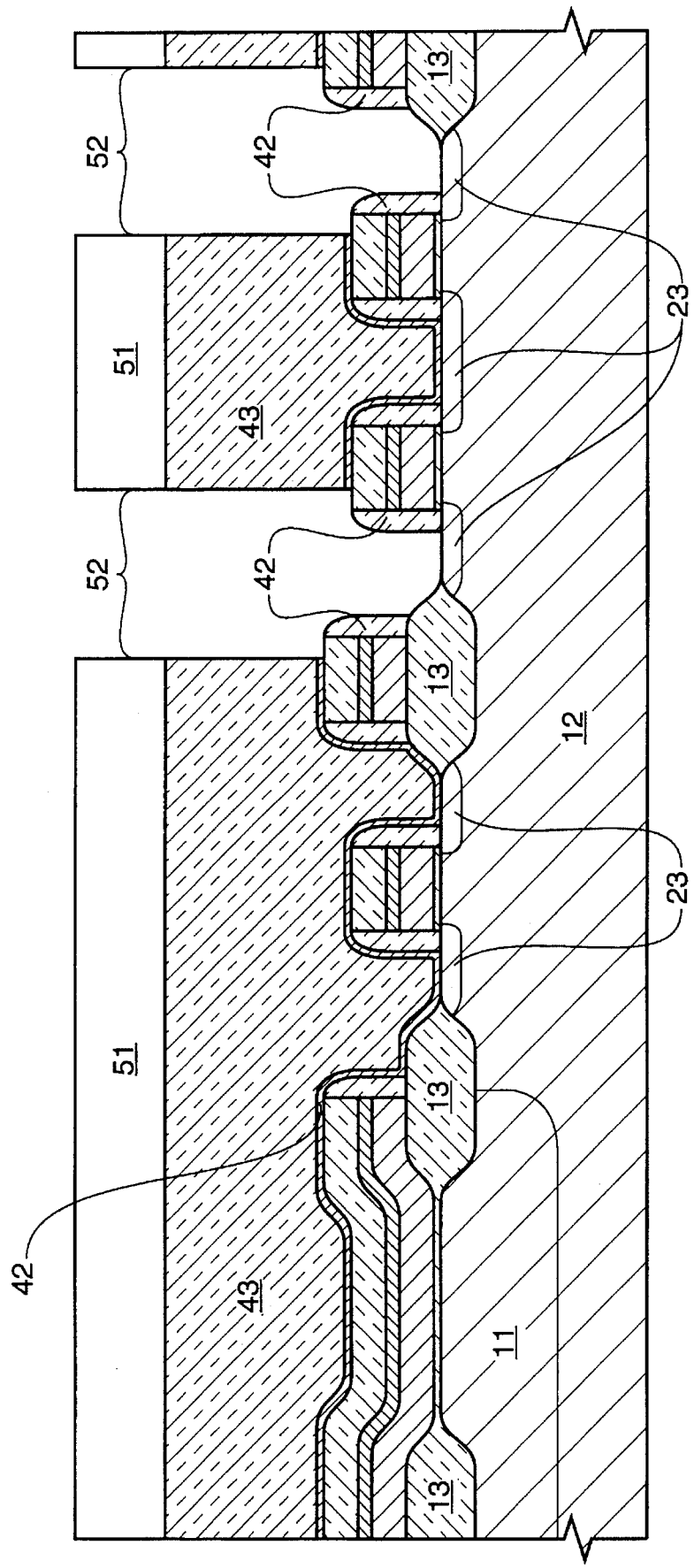
FIG. 5B is a cross-sectional view of the portion of the in-process memory of FIG. 4 following the patterning and etching of the BPSG layer to form storage node contact openings.

Referring now to FIG. 5B, the mold layer 43 is patterned with a contact photoresist mask 51 and etched to form only storage node contact openings 52.

Figure 6A:
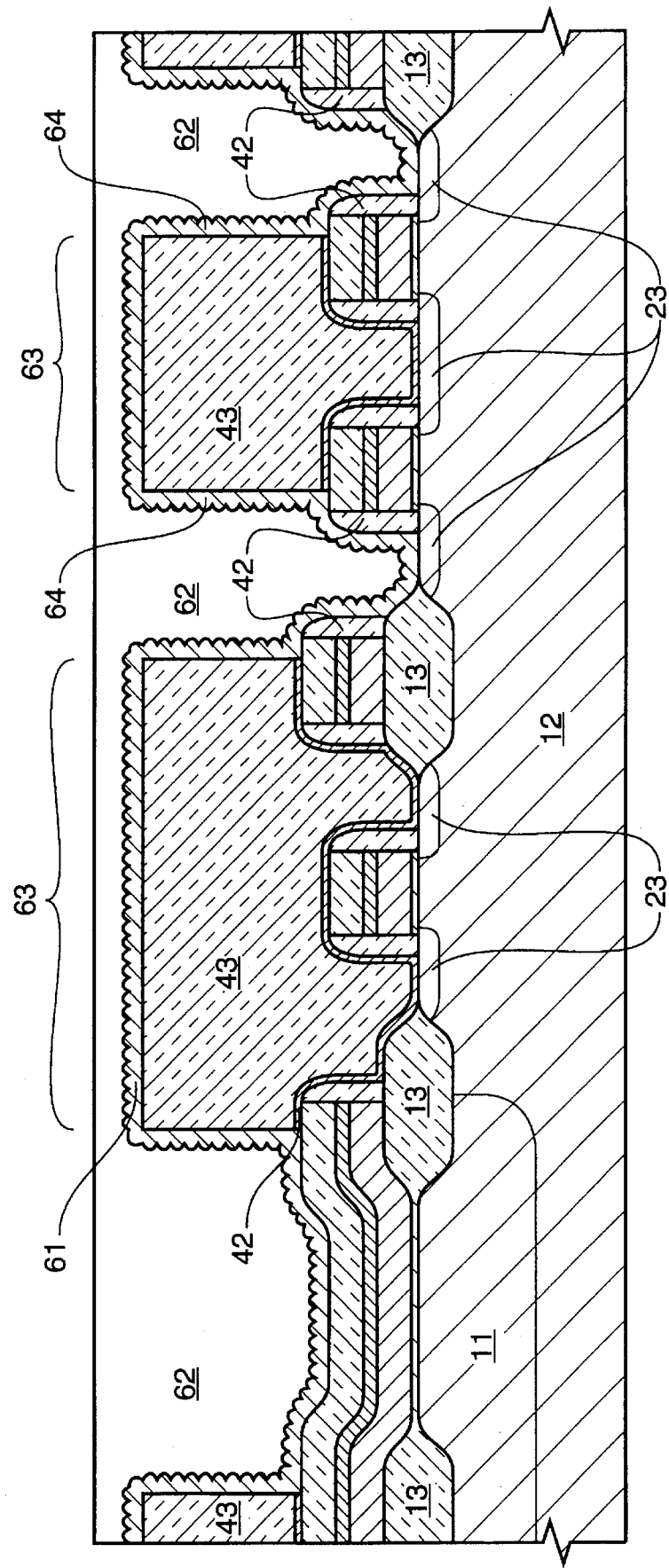
FIG. 6A is a cross-sectional view of the portion of the in-process memory of FIG. 5A following the deposition of a second polysilicon layer and chemical-mechanical planarization of the resulting structure.

Referring now to FIG. 6A, a second conductive layer 61 is blanket deposited (i.e., such that it covers all in-process circuitry). As a capacitance enhancing feature, the second conductive layer 61 is preferably doped hemispherical grain (HSG) silicon. Doping may occur in-situ during deposition, or it may occur subsequent to deposition. The polysilicon-lined N-well region and contact openings are then optionally filled with a filler material 62, such as photoresist. The resulting structure is then planarized a second time, using either a plasma etchback or chemical-mechanical planarization in order to remove horizontal portions 63 of the second polysilicon layer 61. The remaining portions of the second polysilicon layer 61 line the recess in the mold layer 43 above the N-well and the storage-node contact openings 51. The latter portions will function as the storage-node capacitor plate 64.

Figure 6B:
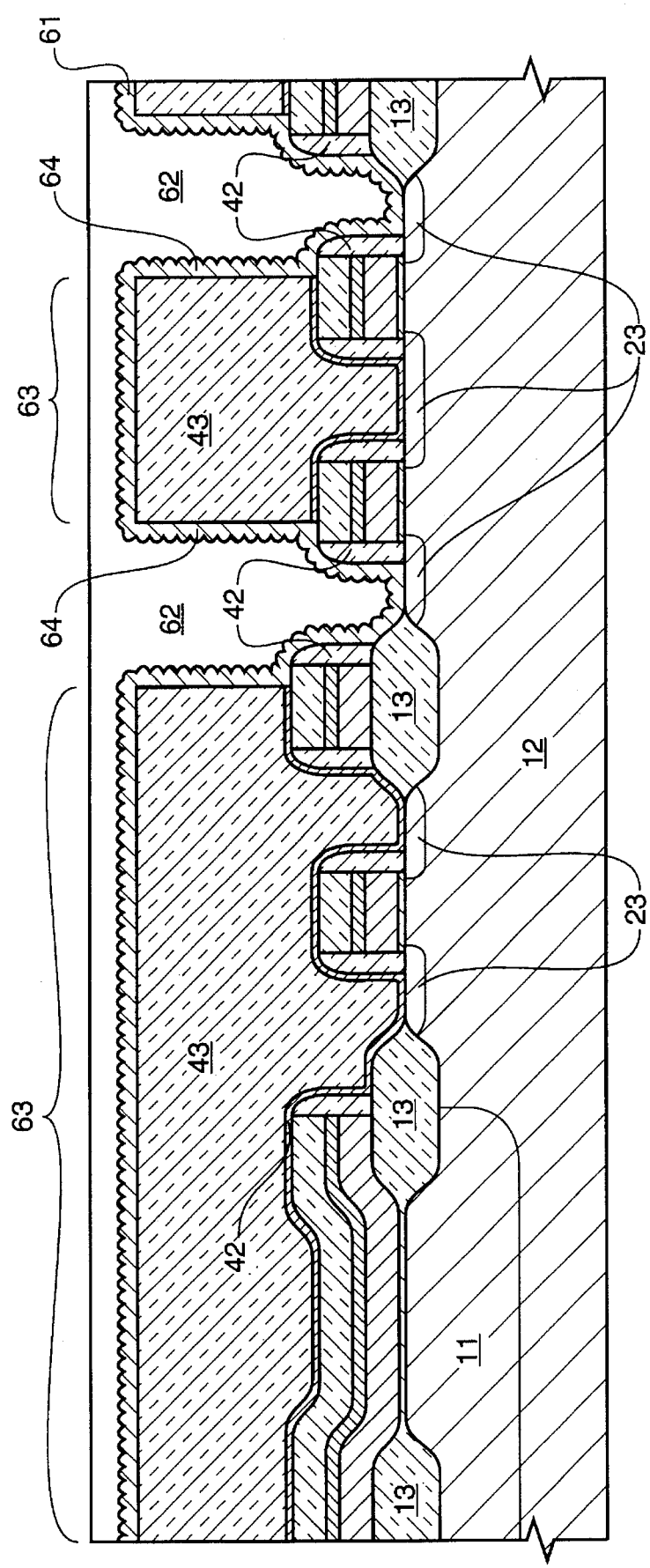
FIG. 6B is a cross-sectional view of the portion of the in-process memory of FIG. 5B following the deposition of a second polysilicon layer and chemical-mechanical planarization of the resulting structure.

Referring now to FIG. 6B, a second conductive layer 61 is blanket deposited (i.e., such that it covers all in-process circuitry). As a capacitance enhancing feature, the second conductive layer 61 is preferably doped hemispherical grain (HSG) silicon. Doping may occur in-situ during deposition, or it may occur subsequent to deposition. The polysilicon-lined contact openings are then optionally filled with a filler material 62 such as photoresist. The resulting structure is then planarized a second time, using either a plasma etchback or chemical-mechanical planarization in order to remove horizontal portions 63 of the second polysilicon layer 61. The remaining portions of the second polysilicon layer 61 will function as the storage-node capacitor plates 64.

It should be noted that the first planarization step described while referring to FIG. 4 may be eliminated so that the second planarization step described while referring to both FIG. 6A and FIG. 6B may be employed both to planarize the mold layer 43 and to singulate the storage-node capacitor plates 64.

Figure 7A:
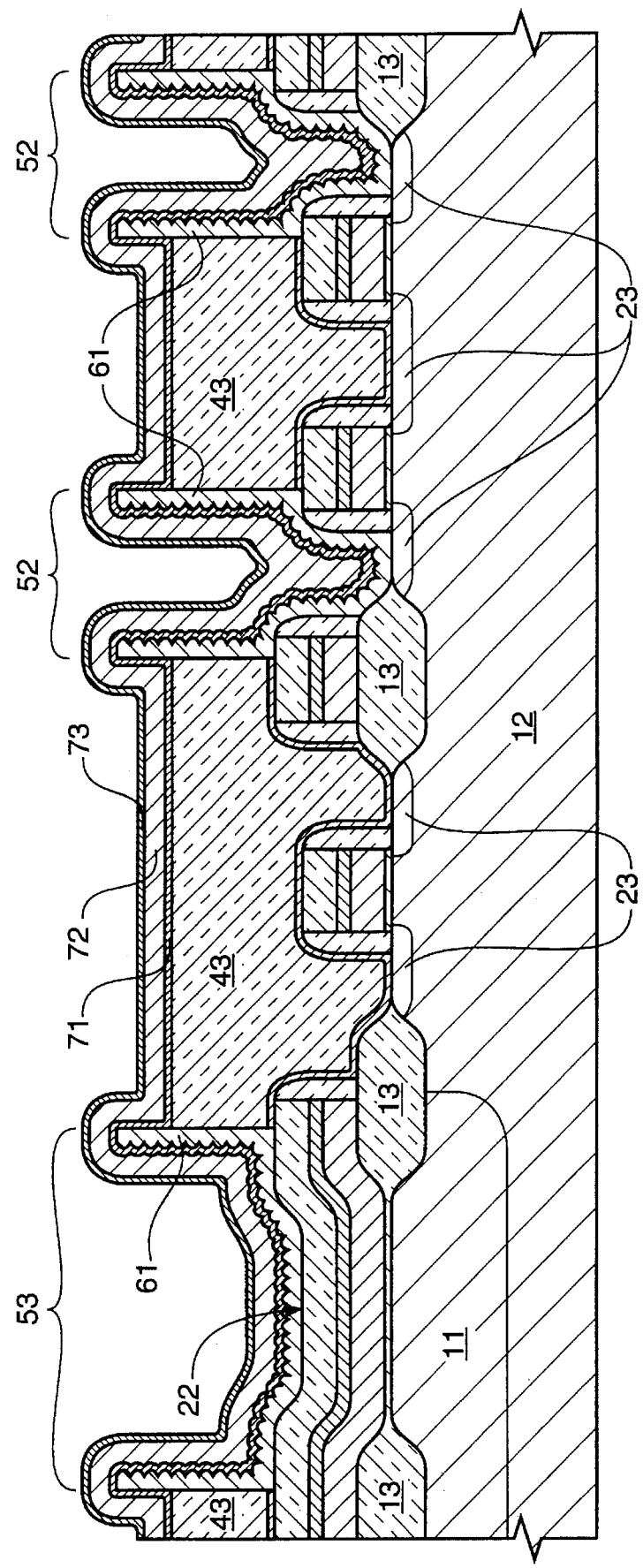
FIG. 7A is a cross-sectional view of the portion of the in-process memory of FIG. 6A following an etch back of the thick insulative layer, deposition of a cell dielectric layer, deposition of a cell plate layer, and optional deposition of silicon nitride capping layer.

Referring now to FIG. 7A, the filler material 62 has been removed and the mold layer 43 is thinned during an etchback step until portions of the second conductive layer 61 which line both the recesses above the unetched three layer expanse 22 and the storage-node contact openings 51 extend above the surface of the mold layer 43. A cell dielectric layer 71 is then formed on at least the exposed surfaces of the remnants of the second polysilicon layer 61. In a preferred embodiment of the process, the cell dielectric layer is a silicon dioxide-silicon nitride-silicon dioxide sandwich, and the silicon nitride layer of this sandwich is blanket deposited via chemical vapor deposition. Following the formation of a cell dielectric layer 71, a conductive cell plate layer 72 is formed on top of the cell dielectric layer 71. In a preferred embodiment of the process, the cell plate layer 72 is also a layer of doped polysilicon. A silicon nitride etch stop layer 73 is then deposited on top of the cell plate layer 72.

Figure 7B:
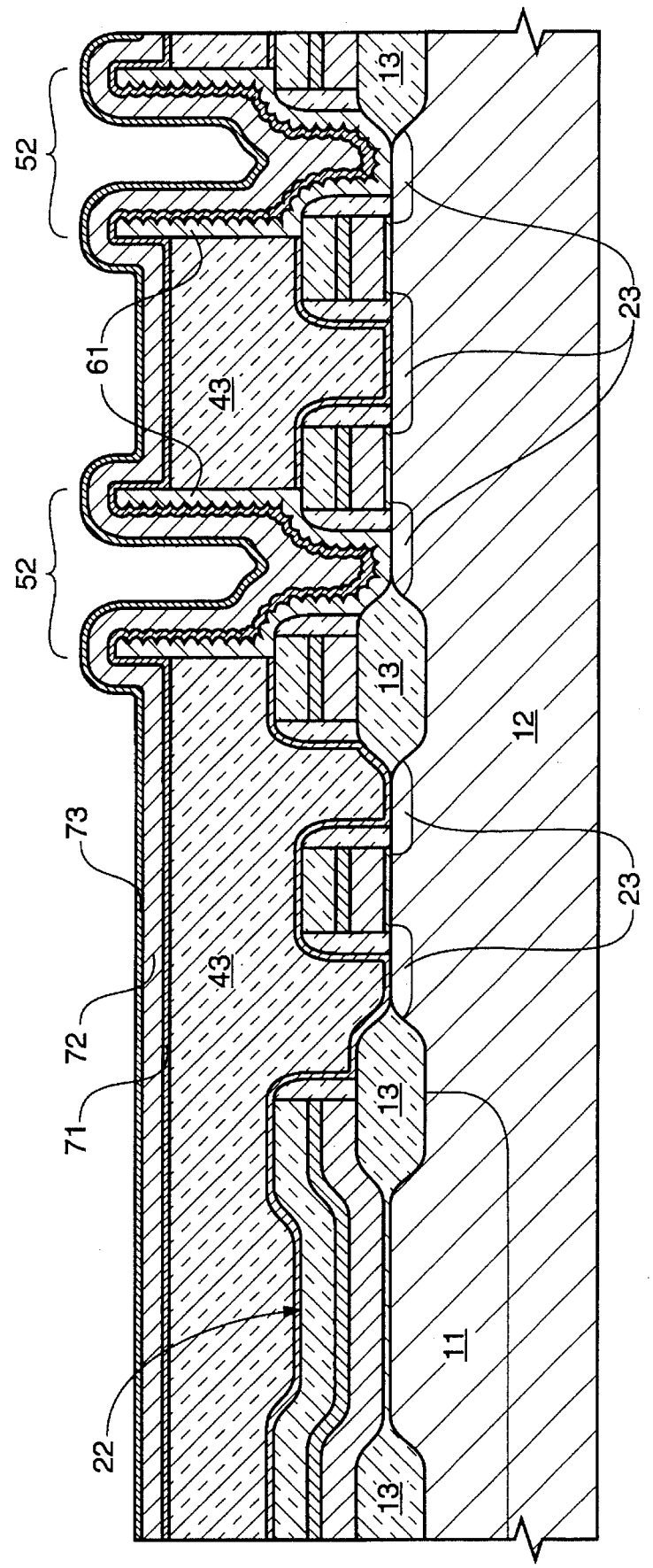
FIG. 7B is a cross-sectional view of the portion of the in-process memory of FIG. 6B following an etch back of the thick insulative layer, deposition of a cell dielectric layer, deposition of a cell plate layer, and optional deposition of silicon nitride capping layer.

Referring now to FIG. 7B, the filler material 62 has been removed and the mold layer 43 is thinned during an etchback step until portions of the second polysilicon layer 61 which line the storage-node contact openings 51 extend above the surface of the mold layer 43. A cell dielectric layer 71 is then formed on at least the exposed surfaces of the remnants of the second polysilicon layer 61. In a preferred embodiment of the process, the cell dielectric layer is a silicon dioxide-silicon nitride-silicon dioxide sandwich, and the silicon nitride layer of this sandwich is blanket deposited via chemical vapor deposition. Following the formation of a cell dielectric layer 71, a conductive cell plate layer 72 is formed on top of the cell dielectric layer 71. In a preferred embodiment of the process, the cell plate layer 72 is also a layer of doped polysilicon. A silicon nitride etch stop layer 73 is then deposited on top of the cell plate layer 72. FIG. 7A is the departing point for two distinct variations of the process. Thus the process continues with either FIG. 8B or FIG. 8C.

Figure 8A:
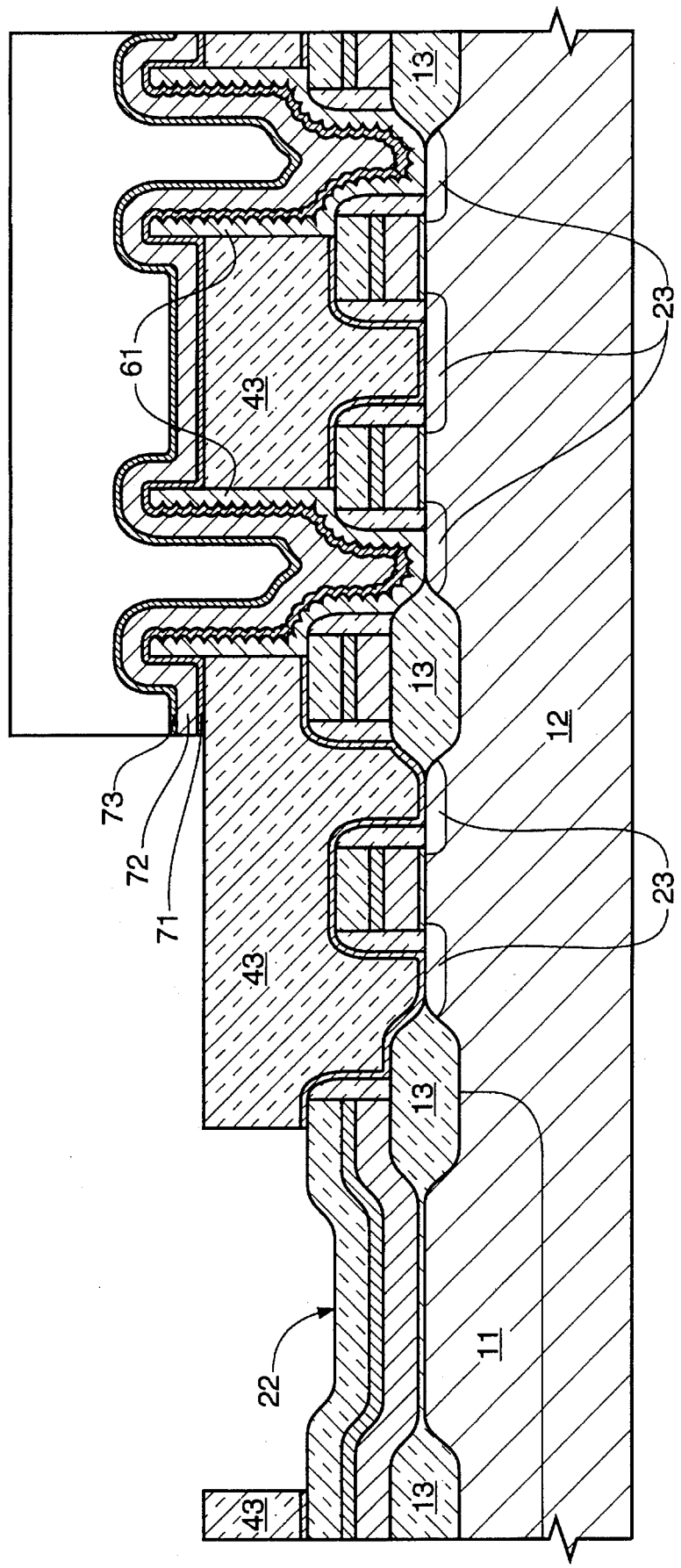
FIG. 8A is a cross-sectional view of the portion of the in-process memory of FIG. 7A following removal of capacitive layers from all but the cell array region.
Figure 8B:
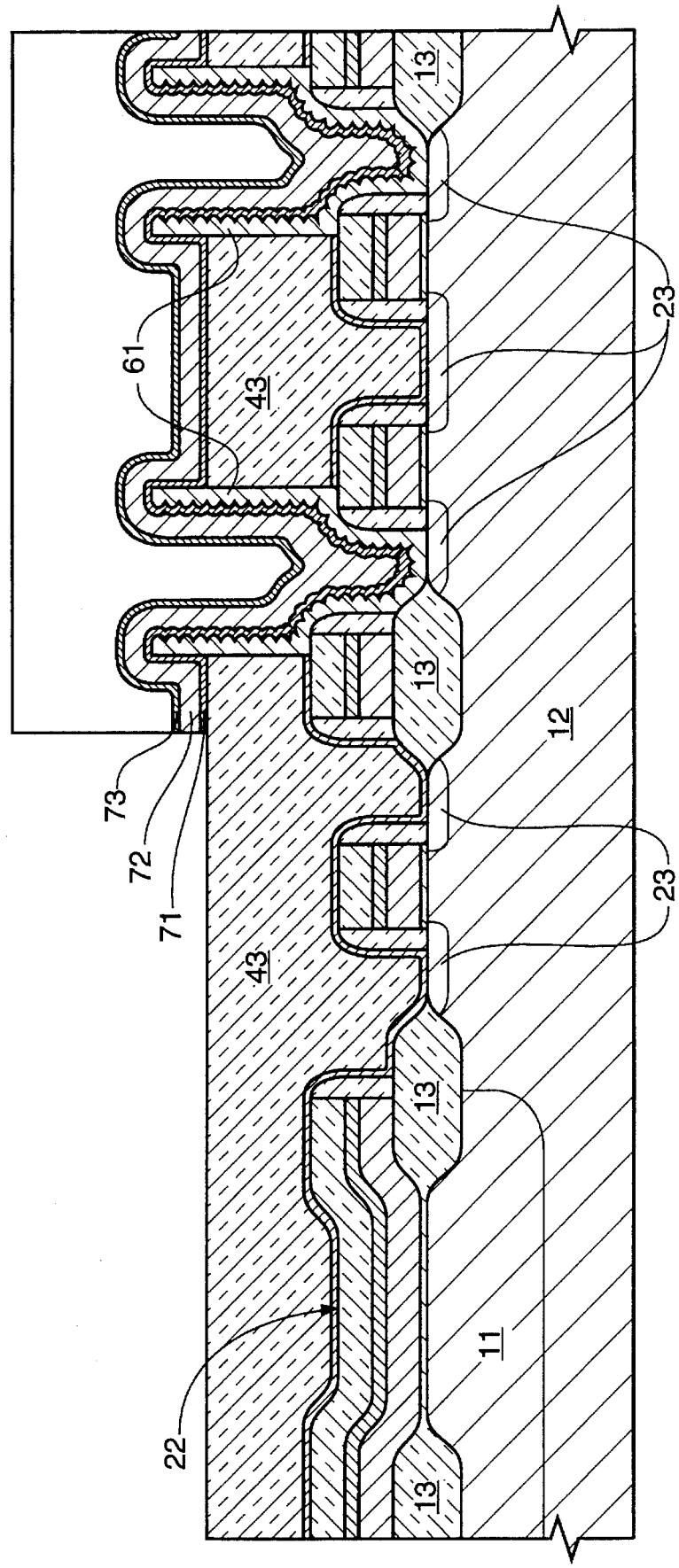
FIGS. 8B and 8C are a cross-sectional view of the portion of the in-process memory of FIG. 7B following removal of capacitive layers from all but the cell array region.

Referring now to FIG. 8A or 8B, the capacitive layers (the second conductive layer 61, the cell dielectric layer 71, and the cell plate layer 72) are removed from all but the cell array region through the use of a series of selective etch steps.

Figure 8C:
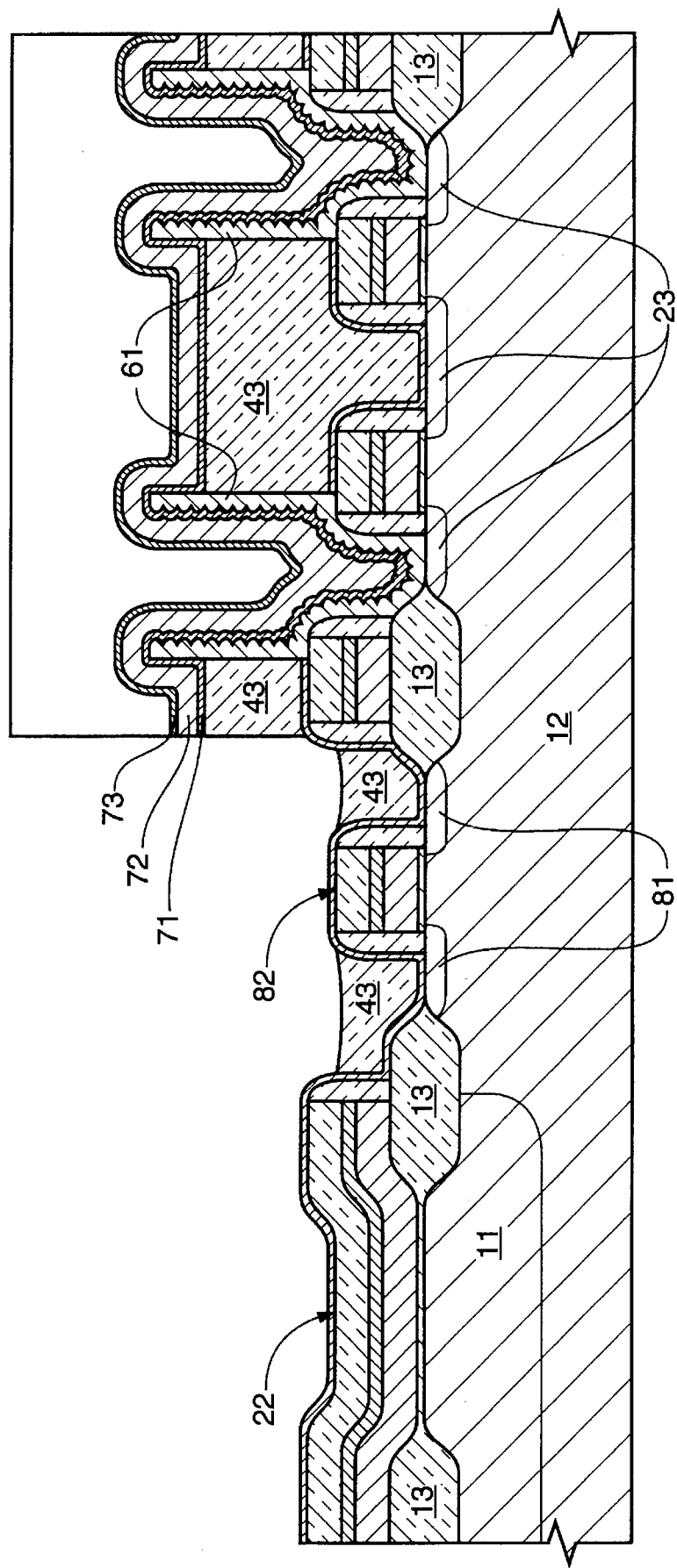

Referring now to FIG. 8C, the capacitive layers (the second conductive layer 61, the cell dielectric layer 71, and the cell plate layer 72) are removed from all but the cell array region through the use of a series of selective etch steps, thus exposing the mold layer 43. The mold layer 43 is then thinned to a level that exposes the upper surface of the unetched three-layer expanse 22, yet does not expose the source/drain regions 81 of N-channel transistors 82 that are peripheral to the cell array.

Figure 9A:
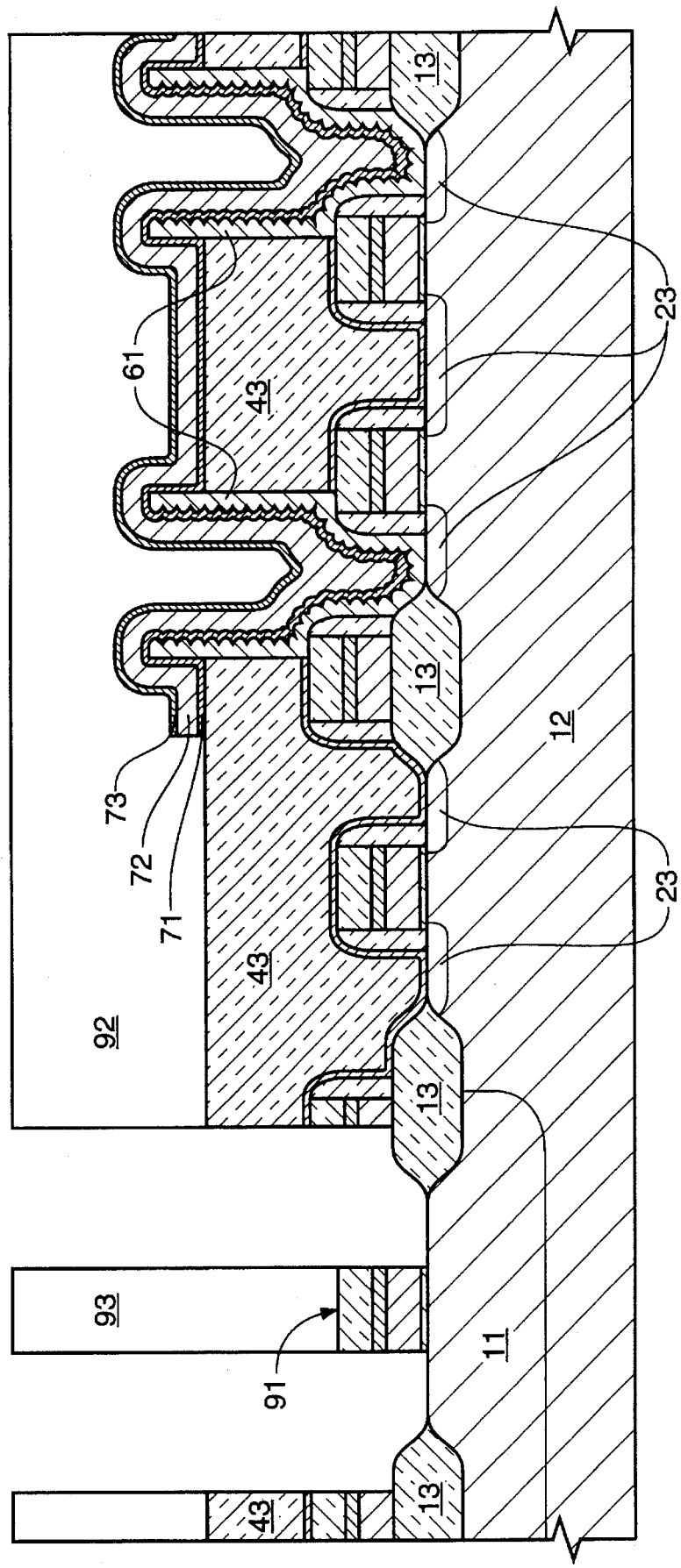
FIG. 9A is a cross-sectional view of the portion of the in-process memory of FIG. 8A following masking of the N-channel region, and patterning and etching of the unetched expanse of sandwich layers in the P-channel region.

Referring to FIG. 9A, following the masking of the entire N-channel region with photoresist, and the masking of the unetched three-layer expanse 22 to provide a mask pattern for P-channel device gates, the in-process circuitry is etched to form those P-channel device gates 91.

Referring to FIG. 9B, following the masking of the entire N-channel region with photoresist, and the masking of the mold layer in the N-well region so as to provide a mask pattern 92 for P-channel device gates, the in-process circuitry is etched to form those P-channel device gates 91. It will be noted that the primary difference between the process of FIG. 9A and 9B at this stage is that patterning of the P-channel devices in FIG. 9B will require an etch through the mold layer 43 before the three-layer expanse 22 is etchable.

Figure 9C:
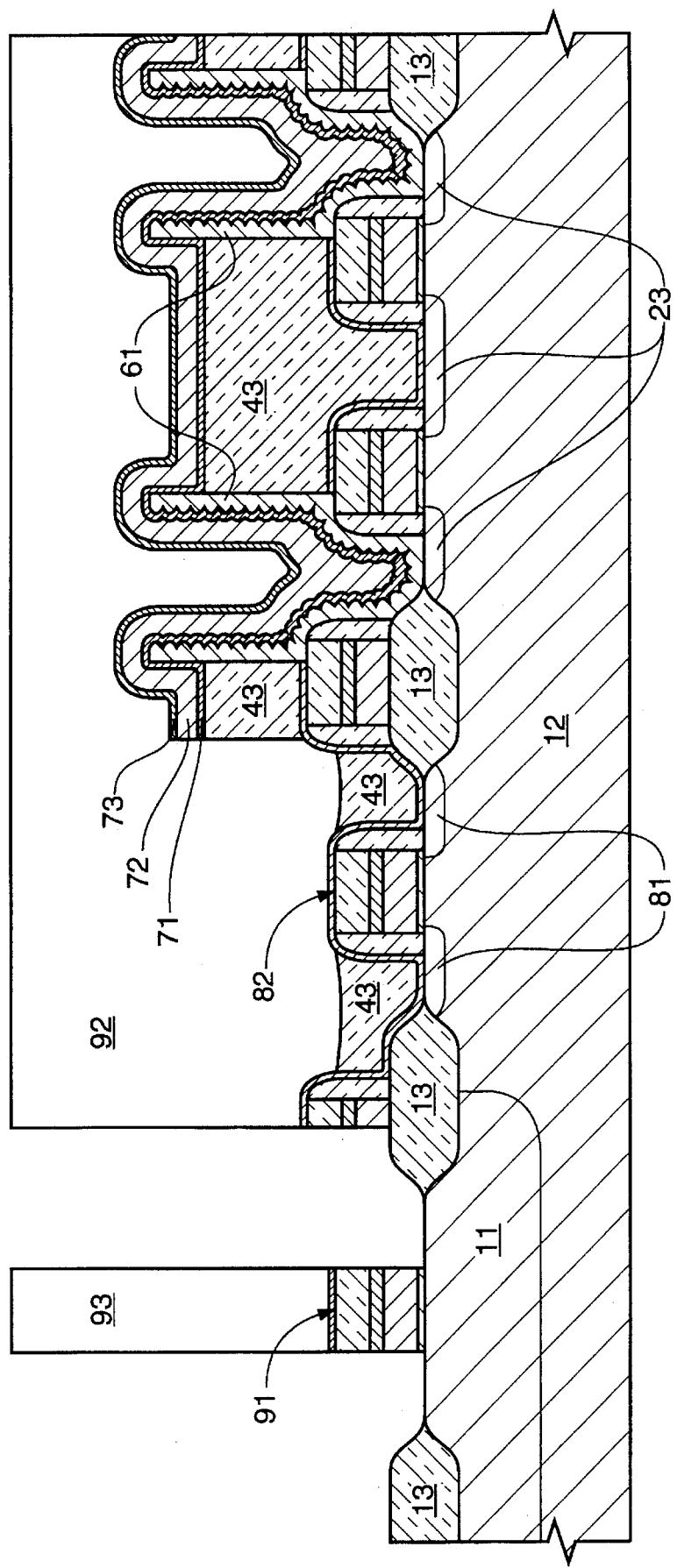

Referring to FIG. 9C, following the masking of the entire N-channel region with a photoresist blanket 91, and the masking of the unetched three-layer expanse 22 to provide a photoresist mask pattern 92 for P-channel device gates, the in-process circuitry is etched to form those P-channel device gates 93.

Figure 10A:
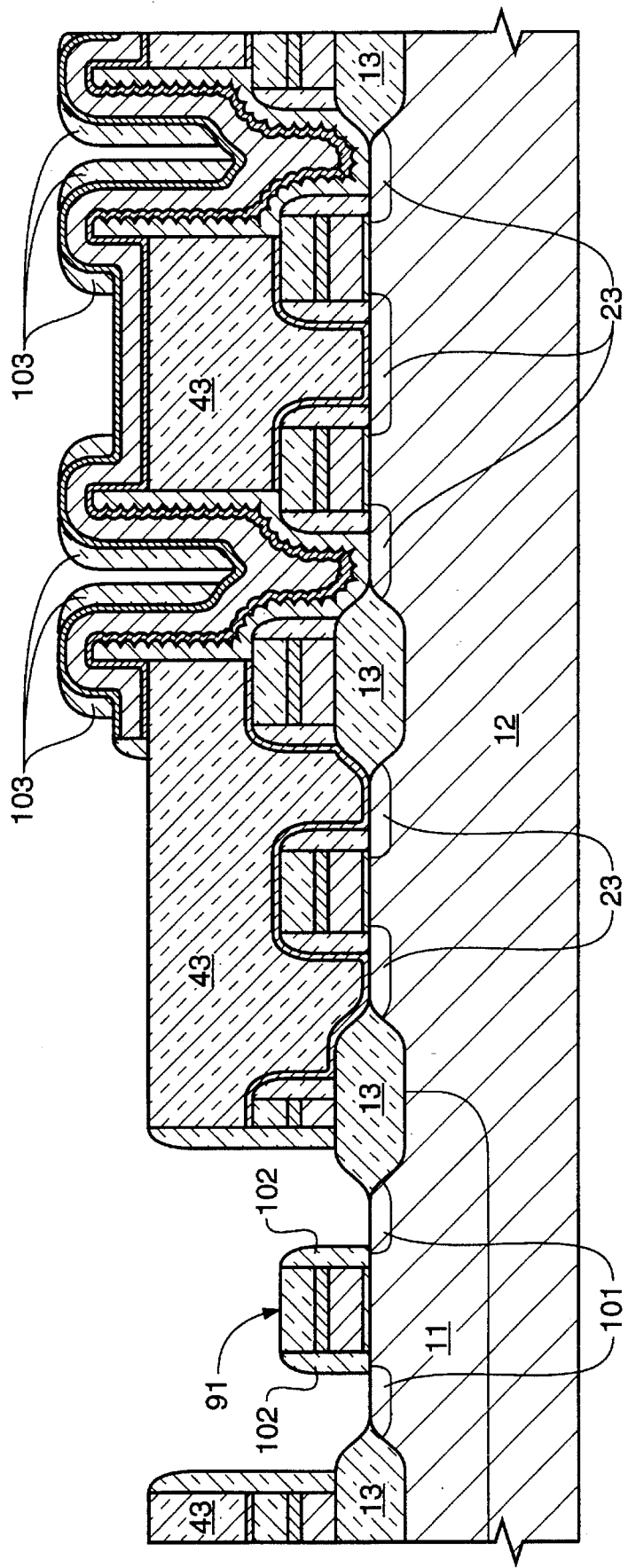
FIG. 10A is a cross-sectional view of the portion of the in-process memory of FIG. 9A following a photoresist strip, deposition of an oxide spacer layer, an anisotropic etch of the oxide spacer layer, and a P-channel source/drain implant.
Figure 10B:
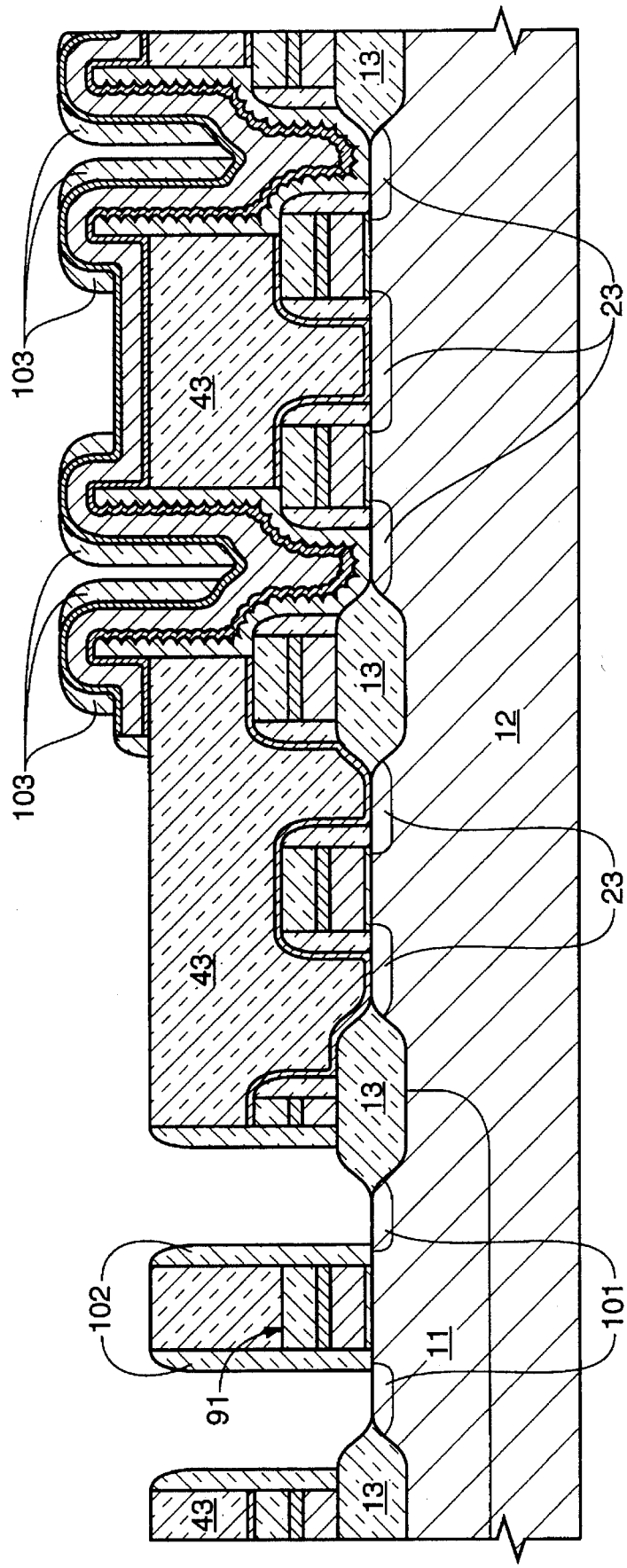
FIGS. 10B and 10C are a cross-sectional view of the portion of the in-process memory of FIG. 9B following a photoresist strip, deposition of an oxide spacer layer, an anisotropic etch of the oxide spacer layer, and a P-channel source/drain implant.
Figure 10C:
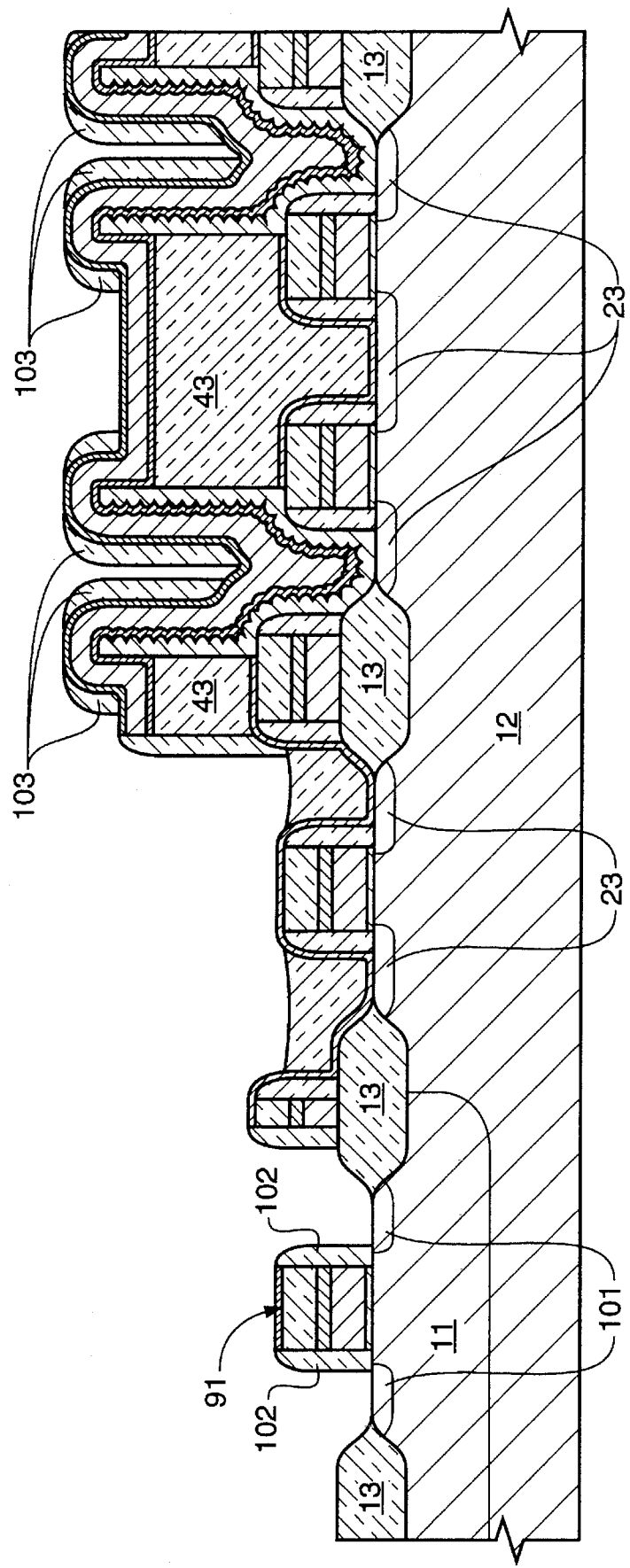

Referring now to FIG. 10A, 10B, or 10C, following a photoresist strip step, a silicon dioxide spacer layer (not shown) is deposited and subsequently anisotropically etched to form spacers 102 on the vertical sidewalls of the P-channel gates 91. It will be noted that non-functional spacers 103 are also formed on the sidewalls of all vertical structures in the N-channel region. Following spacer formation, P-channel source/drain regions 101 are formed with a blanket boron-trifluoride implant.

Although only several embodiments of the new process have been disclosed herein, it will be obvious to those having ordinary skill in the art that modification and changes may be made thereto without departing from the spirit and the scope of the process as hereinafter claimed. For example, although the process is described in the context of an N-well process, a P-well process or a "twin-tub" may be used with equivalent results. The terms "N-type region" and "P-type region" are intended to apply to any of the three cases.

We claim:

1. A CMOS DRAM manufacturing process comprising the following sequence of steps:
   (a) forming both N-type regions and P-type regions within an upper stratum of a silicon substrate;
   (b) forming field isolation regions;
   (c) forming a gate dielectric layer which covers an upper surface of the substrate except where covered by field isolation regions;
   (d) forming a first conductive layer which covers all field isolation regions and the gate dielectric layer;
   (e) patterning N-channel gates from a first portion of said first conductive layer, said first portion overlying said P-type regions, while leaving an unetched second portion of said first conductive layer, said second portion overlying the N-type regions;
   (f) performing at least one N-channel source/drain implant;
   (g) depositing an insulative mold layer which blankets both N-type regions and P-type regions;
   (h) etching storage-node contact openings through said insulative mold layer;
   (i) forming a second conductive layer which blankets both N-type regions and P-type regions and lines said storage-node contact openings;
   (j) removing those portions of said second conductive layer which are on an upper surface of said mold layer, while leaving other portions of said second conductive layer which line said storage-node contact openings, said other portions becoming individual storage-node capacitor plates for individual memory cells;
   (k) forming a cell dielectric layer superjacent said second conductive layer;
   (l) forming a third conductive layer superjacent said cell dielectric layer;
   (m) patterning P-channel gates having vertical sidewalls from the unetched expanse of said first conductive layer; and
   (n) depositing a dielectric spacer layer;
   (o) anisotropically etching the spacer layer to form spacers on the vertical sidewalls of the P-channel gates; and
   (p) performing a blanket P-channel source/drain implant.

2. The CMOS DRAM manufacturing process of claim 1, wherein said mold layer is thinned between steps (j) and (k) by removing mold layer material from an upper surface so as to expose an outer surface of each storage-node plate.

3. The CMOS DRAM manufacturing process of claim 2, wherein a portion of said mold layer that overlies the N-type regions is removed simultaneously with the etching of said storage-node contact openings.

4. The CMOS DRAM manufacturing process of claim 1, wherein the first conductive layer is conductively-doped polysilicon.

5. The CMOS DRAM manufacturing process of claim 1, wherein said first, second, and third conductive layers are conductively-doped polysilicon.

6. The CMOS DRAM manufacturing process of claim 1, wherein the cell dielectric layer contains silicon nitride.

7. The CMOS DRAM manufacturing process of claim 1, wherein boron trifluoride is the dopant impurity employed for the P-channel source/drain implant.

8. A process for manufacturing a CMOS dynamic random access memory on a silicon wafer, said process comprising the following steps:
   (a) forming a first conductive layer on an upper surface of the wafer;
   (b) patterning N-channel gates from a first portion of the first conductive layer, while leaving an unetched second portion of said first conductive layer from which P-channel gates will later be patterned;
   (c) performing at least one N-channel source/drain implant;
   (d) depositing an insulative mold layer which completely overlies said upper surface;
   (e) etching storage-node contact openings through said mold layer;
   (f) forming storage-node plates within the storage-node contact openings from a second conductive layer;
   (g) forming a cell dielectric layer on exposed surfaces of said storage-node plates;

(h) forming a third conductive layer which overlies said cell dielectric layer;

(i) patterning P-channel gates from said second portion of the first conductive layer, said P-channel gates having vertical sidewalls;

(j) depositing a dielectric spacer layer which overlies the upper surface of the wafer;

(k) anisotropically etching the spacer layer to form spacers on the vertical sidewalls of the P-channel gates; and (l) performing a P-channel source/drain implant, which is offset from the sidewalls of the P-channel gates by the spacers.

9. The process of claim 8, wherein the mold layer is thinned between step (f) and step (g) so that at least an upper portion of each storage-node plate is no longer embedded in said mold layer.

10. The process of claim 8, wherein a portion of said mold layer that overlies said second portion of the first conductive layer is removed simultaneously with the etching of said storage-node contact openings.

11. The CMOS DRAM manufacturing process of claim 8, wherein said first, second, and third conductive layers are conductively-doped polysilicon.

12. A process for manufacturing a CMOS dynamic random access memory cell array on a silicon wafer, said process comprising the following steps:

(a) forming a conductive layer on an up:per surface of the wafer;

(b) patterning gates for transistors having a channel of a first conductivity type from a first portion of the conductive layer, while leaving an unetched second portion of the conductive layer from which gates for transistors having a channel of a second conductivity type will later be patterned;

(c) performing at least one source/drain implant for the transistors having a channel of said first conductivity type;

(d) depositing an insulative mold layer which completely overlies said upper surface;

(e) etching a cavity superjacent each memory cell location, each cavity having a floor which is in electrical contact to a source/drain region of one of said transistors having a channel of said first conductivity type;

(f) fabricating a cell capacitor at each memory cell location by using the cavity at each location as a mold to form at least one plate of the capacitor;

(g) patterning gates for transistors having a channel of the second conductivity type from said second portion of the conductive layer, said gates for transistors having a channel of the second conductivity type having sidewalls;

(h) forming spacers on the sidewalls; and (i) performing at least one source/drain implant for the transistors having a channel of said second conductivity type, said at least one implant being offset from the sidewalls of the gates for transistors having a channel of the second conductivity type by the spacers.

13. The process of claim 12, which further comprises the step of etching away at least a portion of the mold layer subsequent to the forming of a first plate of each capacitor.

14. The process of claim 12, wherein said first conductivity type is N-type and said second conductivity type is P-type.

15. The process of claim 12, wherein capacitor: plates are formed from conductively-doped polycrystalline silicon.

16. The process of claim 15, wherein the capacitor plates are insulated from one another by a dielectric layer comprising silicon nitride.

17. The process of claim 12, wherein the mold layer is boro-phospho-silicate glass.

18. The process of claim 12, wherein a portion of the mold layer which overlies the unetched second portion of the conductive layer is removed during the etching of said cavities..

* * * * *